(12) United States Patent
Reboud et al.

(10) Patent No.: US 12,244,119 B2
(45) Date of Patent: Mar. 4, 2025

(54) LASER COMPRISING A DISTRIBUTED BRAGG MIRROR AND PRODUCTION METHOD THEREOF

(71) Applicant: COMMISSARIAT A L'ENERGIE ATOMIQUE ET AUX ENERGIES ALTERNATIVES, Paris (FR)

(72) Inventors: Vincent Reboud, Grenoble (FR); Maryse Fournier, Grenoble (FR); Jean-Marc Fedeli, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 606 days.

(21) Appl. No.: 17/644,870

(22) Filed: Dec. 17, 2021

(65) Prior Publication Data
US 2022/0200239 A1     Jun. 23, 2022

(30) Foreign Application Priority Data
Dec. 18, 2020   (FR) ...................... 20 13657

(51) Int. Cl.
*H01S 5/125* (2006.01)
*H01S 5/042* (2006.01)
(Continued)

(52) U.S. Cl.
CPC .......... *H01S 5/125* (2013.01); *H01S 5/04254* (2019.08); *H01S 5/04256* (2019.08); *H01S 5/1003* (2013.01); *H01S 5/3402* (2013.01)

(58) Field of Classification Search
CPC .. H01S 5/125; H01S 5/04254; H01S 5/04256; H01S 5/1003; H01S 5/3402;
(Continued)

(56) References Cited

U.S. PATENT DOCUMENTS

| 5,311,539 A | * | 5/1994 | Behfar-Rad | ........... G02B 6/122 |
|---|---|---|---|---|
| | | | | 372/50.1 |
| 7,567,606 B2 | | 7/2009 | Carras et al. | |

(Continued)

FOREIGN PATENT DOCUMENTS

EP     1 833 128 A1     9/2007

OTHER PUBLICATIONS

French Preliminary Search Report issued Jun. 24, 2021 in French Application 20 13657 filed on Dec. 18, 2020, 13 pages (with English Translation of Categories of Cited Documents & Written Opinion).

(Continued)

*Primary Examiner* — Xinning (Tom) Niu
(74) *Attorney, Agent, or Firm* — Oblon, McClelland, Maier & Neustadt, L.L.P.

(57) ABSTRACT

A laser includes a distributed Bragg mirror and is configured to emit monochromatic light radiation along a longitudinal direction. The laser has layers, stacked along a first transverse direction normal to the longitudinal direction and made of III-V materials, including an active region configured to emit the radiation. The mirror is formed by periodic lateral corrugations which extend mainly along the longitudinal direction and having a dimension along a second transverse direction normal to the longitudinal direction. The lateral corrugations of the Bragg mirror extend from a top surface of the waveguide pattern along the first transverse direction on a height strictly less than the depth, at which the active region is located starting from the top surface, such that a portion of lateral flanks of the waveguide is free of any lateral corrugations at the active region.

18 Claims, 10 Drawing Sheets

(51) Int. Cl.
 *H01S 5/10* (2021.01)
 *H01S 5/34* (2006.01)
(58) Field of Classification Search
 CPC ........ H01S 5/22; H01S 5/209; H01S 5/04253;
  H01S 5/1082; H01S 5/2027; H01S
  5/3401; H01S 2301/176; H01S 2301/18;
  H01S 5/1237
 See application file for complete search history.

(56) References Cited

U.S. PATENT DOCUMENTS

| | | | |
|---|---|---|---|
| 9,991,677 B2 | 6/2018 | Briggs et al. | |
| 2007/0248134 A1* | 10/2007 | Hatori | B82Y 20/00 372/45.01 |
| 2008/0232417 A1* | 9/2008 | Hatori | B82Y 20/00 438/47 |
| 2009/0116522 A1* | 5/2009 | Watson | H01S 5/12 257/E33.001 |
| 2018/0076597 A1* | 3/2018 | Fukumizu | H01S 5/1064 |
| 2020/0203925 A1 | 6/2020 | Hung et al. | |

OTHER PUBLICATIONS

Dridi et al., "Narrow-Linewidth and Single-Mode 1.55 μm Laterally-Coupled Distributed Feedback Laser Fabricated By Standard I-Line Stepper Lithography", ACP Technical Digest, 2012, 3 pages.

Koeth et al., "Mid infrared DFB interband cascade lasers", Proc. SPIE 10403, Infrared Remote Sensing and Instrumentation XXV, 2017, 7 pages.

Slight et al., "Short Wavelength Distributed Feedback Quantum Cascade Laser", Lasers and Electro-optics, 2009, 2 pages.

Wang et al., "1.3 μm Laterally Coupled Distributed Feedback Laser with High Side Mode Suppression Ratio and Bandwidth", Asia Communications and Photonics Conference (ACP), 2019, 3 pages, paper T3D.3.

Wang et al., "1.3 μm laterally-coupled distributed feedback laser with a triangular prism etched facet", Proc. SPIE 11023, Fifth Symposium on Novel Optoelectronic Detection Technology and Application, 2019, 4 pages.

Yang et al., "2-μm single longitudinal mode GaSb-based laterally coupled distributed feedback laser with regrowth-free shallow-etched gratings by interference lithography", Chinese Phys. B, vol. 25, No. 2, 2016, 5 pages.

Yu et al., "High-power, room-temperature, and continuous-wave operation of distributed-feedback quantum-cascade lasers at $\lambda \sim 4.8$ μm", Appl. Phys. Lett. 87, 041104, 2005, 1 page (Abstract Only).

Koehler et al., "Single-mode tunable, pulsed, and continuous wave quantum-cascade distributed feedback lasers at $\lambda \cong 4.6\text{-}4.7$ μm", Appl. Phys. Lett. 76, 1092, 2000, 1 page, (Abstract Only).

Hofstetter et al., "High-temperature operation of distributed feedback quantum-cascade lasers at 5.3 μm", Appl. Phys. Lett. 78, 396, 2001, 3 pages.

Carras et al., "Top grating index-coupled distributed feedback quantum cascade lasers", Appl. Phys. Lett. 93, 011109, 2008, 1 page (Abstract Only).

Coutard et al., "Volume Fabrication of Quantum Cascade Lasers on 200 mm-CMOS pilot line", Scientific Reports, 10(1), 6185, 2020, 8 pages.

* cited by examiner

Without DBF

With DBF

Section A-A

Section A-A

Section A-A

Section A-A

Section A-A

LASER COMPRISING A DISTRIBUTED BRAGG MIRROR AND PRODUCTION METHOD THEREOF

TECHNICAL FIELD

The present invention relates to the field of optoelectronics. It can be implemented to produce light-emitting components, particularly in the mid-infrared (MIR) spectral range. It finds a particularly advantageous application in the production of distributed Bragg mirrors for quantum cascade laser sources in CMOS compatible technology. An example of a particular application is environmental sensors using MIR sources.

PRIOR ART

A laser comprising a distributed Bragg reflector is called a Distributed FeedBack (DFB) laser.

The laser can be based on a quantum cascade amplification principle. In this case, such a laser is called a QCL (Quantum Cascade Laser).

One functional principle of the quantum cascade laser is that the active region of the laser is electrically polarised via electrodes, such that electrons are injected. This active region typically comprises a multiplicity of quantum wells wherein an electron will successively lose part of its energy, in a cascade, while emitting a photon of given energy each time. These photons form the light radiation of wavelength $\lambda$.

This light radiation propagates in a guided manner inside the optical cavity of the laser. This optical cavity is typically bounded by bottom and top layers called LOC (acronym for "Low Optical Confinement"), and at least one Bragg reflector.

The distributed Bragg reflector is a mirror that can reflect light radiation with a given wavelength $\lambda$ with a reflectivity R greater than 99%. Such a mirror typically comprises periodic corrugations with different refractive indices. A partial reflection of the light radiation occurs with each alternating index. For a grating pitch of the order of $\Lambda = m \cdot \lambda / 2n$, where n is the effective refractive index and m is the grating order, the partial reflections combine by constructive interference, and the corrugations "distributed" along the grating act as a high-quality mirror.

Distributed Bragg reflectors or mirrors are therefore particularly advantageous for manufacturing single-mode lasers with a very narrow spectral width.

Among the many applications of optical systems comprising DFB QCL lasers, the detection of chemical or biological elements ($CO_2$, $CH_4$, $NH_3$ ..., glucose ...) is particularly interesting. The very narrow spectral width of DFB QCL lasers helps to advantageously increase the detection sensitivity.

The performance of these DFB QCL lasers depends particularly on the quality of the distributed Bragg reflectors and the quality of the electron injection into the active region.

Document US 2015333482 A1 discloses a DFB QCL laser architecture designed to emit monochromatic light radiation along a longitudinal direction x. As schematically illustrated on FIG. 1, the key elements of this architecture comprise a stack 10 along z of layers made of III-V materials, and a Bragg reflector 65 formed by periodic lateral corrugations 6 of period $\Lambda$ on the lateral flanks 101, 102 of the stack 10.

This architecture further includes a top electrode 50 arranged on top of the stack 10 of layers. Such an architecture helps to inject electrons via the top electrode, while displaying good reflectivity via the lateral DFB structuring.

However, there is a need to further improve the performance of a lateral DFB-structured laser.

It is therefore an object of the present invention to provide a lateral DFB-structured laser with enhanced performance.

It is also an object of the present invention to provide a method of manufacturing such a laser.

The other objects, features and advantages of the present invention will become apparent upon examination of the following description and accompanying drawings. It is understood that other advantages can be incorporated. In particular, certain characteristics and certain advantages of the laser may apply mutatis mutandis to the method, and vice versa.

SUMMARY

In order to achieve this objective, a laser comprising a distributed Bragg mirror is proposed in one embodiment.

The laser is designed to emit light radiation along a longitudinal direction x and comprises a waveguide formed at least in part in a stack of layers made of III-V materials. This waveguide comprises at least one active region of the stack, said active region having been configured to emit said light radiation. The at least one active region is located at a depth $h_a$ measured along the first transverse direction z from the top surface of the stack, the first transverse direction z being perpendicular to the longitudinal direction x.

The Bragg mirror comprises lateral corrugations arranged periodically along x in a period $\Lambda$. These lateral corrugations are carried by at least one lateral flank of the waveguide that is parallel to a lateral plane xz defined by the longitudinal direction x and the first transverse direction z. These lateral corrugations have a height h' along the first transverse direction z and a dimension d along a second transverse direction y that is normal to the longitudinal direction x.

Advantageously, the lateral corrugations of the Bragg mirror extend from the top surface of the waveguide and the height h' is strictly less than the depth $h_a$, such that a portion of the at least one lateral flank of the waveguide is free of any lateral corrugations at the at least one active region.

In particular, the lateral corrugations do not extend over any lateral flanks of the active region. The active region thus remains intact under the top electrode.

The active region of an QCL laser can be decomposed into separate functional areas: photon emission areas and electron injection areas. Structurally, the quantum well stack in the active region can serve as a Bragg resonator, particularly in the injection areas, for the electron wave functions. This can then generate a low amplitude band gap between the emission areas.

In the development of the present invention, it has been observed that the lateral DFB structuring of the active region according to the prior art generates characteristic lengths $\Lambda/2$ along x in the active region, for each emission area and each injection area. Such a characteristic dimension is smaller than the electron scattering length. This greatly disturbs the injection of electrons, particularly in the vicinity of the lateral DFB structuring. In particular, the corrugations increase the developed surface of the lateral flanks of the active region. The passivation of these lateral flanks is imperfect. The probability of non-radiative recombinations therefore increases, and all the more so as the width of the corrugations is smaller than the electron scattering length.

Therefore, these electrons do not contribute to light emission. The injection efficiency is thus reduced. The laser threshold is increased. By construction, it therefore appears that lateral DFB structuring of the active region causes inefficient electron injection.

In order to avoid lateral structuring of the active region of the QCL lasers, the lateral DFB structuring in this instance is performed only at the top layers of the stack, located above the active region. This helps to substantially minimise the optical losses of the laser. This also helps to improve electrical injection into the active region.

In order to improve the DFB's reflectivity, the period $\Lambda$ and the dimension d of the lateral corrugations are preferably chosen such that $d/\Lambda>1$. This helps to achieve an effective optical feedback. Such lateral DFB structuring also helps to achieve proper control of the far field and/or the near field associated with the light radiation emitted by the QCL laser.

The laterally structured Bragg reflector above the active region thus helps to achieve the optical performance required for the DFB QCL while ensuring improved electrical injection. The performance of the laser is thus improved.

In another aspect, a method of forming a laser comprising a distributed Bragg mirror is proposed. This method comprises:
  Providing a stack of layers made of III-V materials comprising at least one active region for emitting light radiation,
  Forming a waveguide pattern in the layer stack, said waveguide pattern having a length L along a longitudinal direction x, a height h along a first transverse direction z and a width w along a second transverse direction y, the first and second transverse directions z, y being normal to the longitudinal direction x, said waveguide pattern having a top surface and lateral flanks extending parallel to a lateral plane xz defined by the longitudinal direction x and the first transverse direction z,
  Structuring said waveguide pattern so as to form lateral corrugations at said lateral flanks, said lateral corrugations being periodic with period A along the longitudinal direction x and having a dimension d along the second transverse direction y, and at least partly forming the distributed Bragg mirror.

Advantageously, said structuring is configured such that the lateral corrugations of the Bragg mirror extend from the top surface of the waveguide pattern along the first transverse direction z on a height h' strictly less than the depth $h_a$, at which the at least one active region is located starting from the top surface of the waveguide pattern, such that a portion of the lateral flanks of the waveguide is free of any lateral corrugations at the at least one active region.

This method is typically used to produce lasers as described above, with improved performance. This method is also typically based on a silicon technology process that is advantageously compatible with a so-called CMOS production line (production of complementary metal-oxide-semiconductor transistors).

BRIEF DESCRIPTION OF THE FIGURES

The goals, objects, features and advantages of the invention will become more apparent from the detailed description of embodiments of the invention illustrated by the following accompanying drawings wherein.

Figure 1:
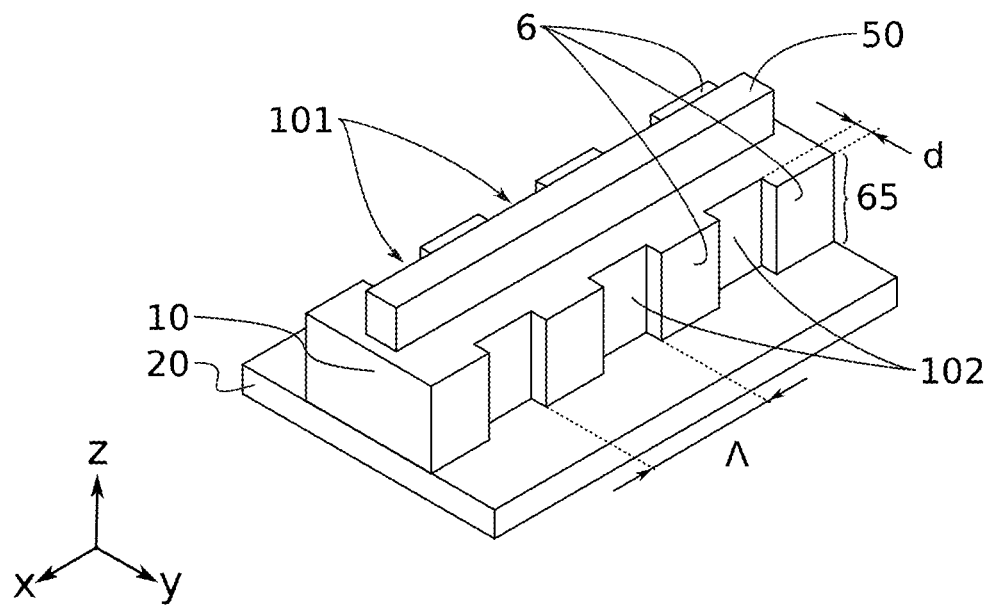
FIG. 1 schematically illustrates a laterally structured DFB laser according to the prior art.

The drawings are given by way of examples and not intended to limit the invention. They constitute schematic representations of principle designed to facilitate understanding of the invention and are not necessarily on the scale of practical applications. In particular, the thicknesses of the various layers, and the dimensions of the corrugations and patterns in the schematic diagrams do not represent the reality.

DETAILED DESCRIPTION

Before proceeding to a detailed review of embodiments of the invention, the following are optional features that may be used in combination or alternatively:

In one example, the lateral corrugations of the Bragg mirror are distributed and designed such that d/Λ>1. This helps to increase the DFB's reflectivity. This helps to prevent a degradation of the far-field intensity distribution of the light radiation. In particular, the divergence of the light radiation is thus reduced. The fact that the lateral corrugations do not extend to the active region also reduces the divergence of the beam formed by the light radiation. The beam is therefore less divergent in such a waveguide, all other things being equal, than in a waveguide of a laser according to the prior art.

According to one example, the stack of layers comprises at least an optical confinement layer, called LOC, preferably InGaAs-based and located above the at least one active region, at a depth $h_c$ along the first transverse direction z from the top surface.

In one example, the lateral corrugations of the Bragg mirror extend from the top surface along a height h' strictly less than the depth $h_c$, such that a portion of the at least one lateral flank of the waveguide is free of any lateral corrugations at said optical confinement layer. This helps to substantially minimise optical losses.

In one example, the lateral corrugations are far from the at least one active region by a distance $h_a$-h' along the first transverse direction z, $h_a$-h' being greater than or equal to 200 nm. This helps to substantially minimise optical losses.

In one example, the height h' of the lateral corrugations of the Bragg mirror are greater than or equal to 500 nm, for example of the order of 1 μm or 1.2 μm. This helps to achieve good DFB reflectivity.

In one example, the laser also comprises a top electrode arranged on the top surface of the waveguide. Electrical injection efficiency is thus enhanced.

In one example, the top electrode comprises a top portion covering the top surface of the waveguide and at least one lateral portion covering the lateral corrugations. Accordingly, the electrode is directly in contact with the lateral corrugations. The lateral corrugations are made of semiconductor material. The electrode is made of metal material. This helps to form a metal/semiconductor interface between the electrode and the lateral corrugations. Such an interface improves the optical feedback effectiveness of the lateral corrugations. The DFB reflectivity is thus enhanced. The contact surface between the electrode and the waveguide is increased. Electronic injection efficiency is thus enhanced.

In one example, the at least one lateral portion of the top electrode has metal corrugations covering the lateral corrugations of the Bragg mirror. Accordingly, the top electrode in itself is structured such that is also has metal corrugations. The DFB reflectivity is thus further enhanced. Electronic injection efficiency is also enhanced.

In one example, the waveguide has a height h less than or equal to 4 μm. This helps to improve the optical reflection efficiency of the lateral Bragg reflector. This height h value can be optimised depending on the emission wavelength, the guide width and the stack of layers made of III-V materials.

In one example, the waveguide has a width w less than or equal to 10 μm, for example of the order of 6 μm or 8 μm. This helps to minimise the number of optical modes propagated within the waveguide. Advantageously, only the fundamental mode of the light radiation propagates within the waveguide. The laser s efficiency is thus enhanced.

In one example, the laser is a quantum cascade laser.

According to one example, the stack comprises a stopping layer located above the at least one active region, and the structuring of the lateral corrugations is configured such that the lateral corrugations do not extend beyond said stopping layer along the first transverse direction z, said stopping layer being located at a depth substantially equal to h' with respect to the top surface of the waveguide pattern. This helps to protect the at least one active region during the structuring or formation of the lateral corrugations, typically by etching. In particular, this helps to more accurately control an etch depth when forming the lateral corrugations by etching. The height h' of the lateral corrugations is thus accurately defined.

In one example, the stopping layer is InGaAs-based and has a thickness e' of between 20 nm and 200 nm. An InGaAs-based stopping layer typically has a refractive index that is low enough for laser applications. It is preferably doped so as to allow for carrier transfer during operation of the laser. The thickness e' is preferably less than a critical thickness defining a plastic relaxation area. This helps to create a pseudomorphic stopping layer. In one example, the stopping layer is pseudomorphic.

In one example, the method also comprises a formation of a top electrode pattern that is at least partly on the top surface of the waveguide pattern.

In one example, the formation of the top electrode pattern comprises a deposition of a metal layer on the top surface and on the lateral corrugations, and a structuring of said metal layer, such that the said top electrode pattern has a top portion covering the top surface of the waveguide and at least a lateral portion covering the lateral corrugations.

In one example, the structuring of the metal layer is configured such that the at least one lateral portion of the electrode pattern has lateral flanks that are parallel to the lateral plane xz and free of any lateral corrugations.

In one alternative example, the structuring of the metal layer is configured such that the at least one lateral portion of the electrode pattern has metal corrugations covering the lateral corrugations.

Barring any incompatibility, it is understood that the manufacturing method and the laser may comprise, mutatis mutandis, all of the optional characteristics hereinabove.

In the present invention, the terms "Bragg mirror", "Bragg grating" or "distributed Bragg reflector" or even "DFB (Distributed FeedBack)" are used synonymously. The Bragg mirror is configured in this instance to be used as a reflector for a waveguide. It comprises a periodic alternation of materials with different refractive indices. This alternation induces a periodic variation of the effective refractive index in the waveguide. Such an alternation is reproduced at least twice in a Bragg mirror according to the present invention.

This alternation is typically produced by lateral corrugations. Lateral corrugations refer to elements projecting from a lateral plane. They may have different profiles projecting along an xy plane, for example and not restrictively: a crenelated profile as illustrated in the accompanying drawings, or a sinusoidal or triangular profile.

It is specified that, in the present invention, the terms "on", "overlying", "overlapping", "underlying", "with" and their equivalents do not necessarily mean "in contact with". For example, the deposition of a first layer on a second layer does not necessarily mean that the two layers are directly in contact with each other, but rather means that the first layer at least partially overlaps the second layer by being either directly in contact or separated from it by at least one other layer or at least one other element.

Additionally, a layer may be composed of multiple sub-layers of the same material or different materials.

A substrate, a stack, a layer, "made of", "based on" a material A or "A-based", means a substrate, a stack, a layer comprising the material A only or the material A and optionally other materials, such as alloying elements and/or doping elements.

The doping ranges associated with the different types of doping indicated in the present application are the following:
  doping p++ or n++: greater than $1 \times 10^{20}$ cm$^{-3}$
  doping p+ or n+: $1 \times 10^{18}$ cm$^{-3}$ to $9 \times 10^{19}$ cm$^{-3}$
  doping p or n: $1 \times 10^{17}$ cm$^{-3}$ to $1 \times 10^{18}$ cm$^{-3}$
  Intrinsic doping: $1.10^{15}$ cm$^{-3}$ to $1.10^{17}$ cm$^{-3}$ The examples of embodiments described hereinafter indicate n-type doping. Other embodiments wherein p-type doping is performed can also be considered. Accordingly, QCL lasers wherein the charge carriers are holes can also be produced according to the present invention.

The mid-infrared (MIR) range typically comprises wavelengths λ of between 3 µm and 12 µm. An example of implementation of the method is provided for making a DFB QCL laser emitting at a wavelength of 7.4 µm. The Bragg mirror typically has a reflectivity peak centred on the wavelength λ.

Several embodiments of the invention implementing successive steps of the fabrication method are described below. Unless explicitly stated, the adjective "successive", even if it is generally preferred, does not necessarily imply that the steps immediately follow each other, since they can be separated by intermediate steps.

Furthermore, the term "step" implies the performance of a part of the method, and can designate a set of sub-steps.

Furthermore, the term "step" does not necessarily mean that the actions carried out during a step are simultaneous or immediately successive. In particular, some actions of a first step may be followed by actions related to a different step, and other actions of the first step may be repeated afterwards. Accordingly, the term step does not necessarily mean unitary and inseparable actions in time and in the sequence of the method's phases.

A preferably orthonormal reference marker comprising the x, y, z axes is shown on the figures annexed hereto. When only one reference mark is shown on a single sheet of figures, this reference marker applies to all the figures on this sheet.

In the present patent application, the thickness of a layer is taken along a direction normal to the main plane of extension of the layer. Accordingly, a layer of the stack typically has a thickness along z. The height and depth are taken along z. The relative terms "on", "overlying", "under", "underlying", "above" refer to positions taken along the direction z.

The terms "vertical", "vertically" refer to a direction along z. The terms "horizontal", "horizontally" refer to a direction along the xy plane. The term "lateral" refers to an xz plane. Accordingly, lateral corrugations are carried by an xz plane. Lateral structuring is carried out at an xz plane.

An element located "flush with" or "in line with" another element means that these two elements are both located on the same line perpendicular to a plane in which a bottom or top face of a substrate mainly extends, i.e. on the same line running vertically on the figures.

Figure 2A:
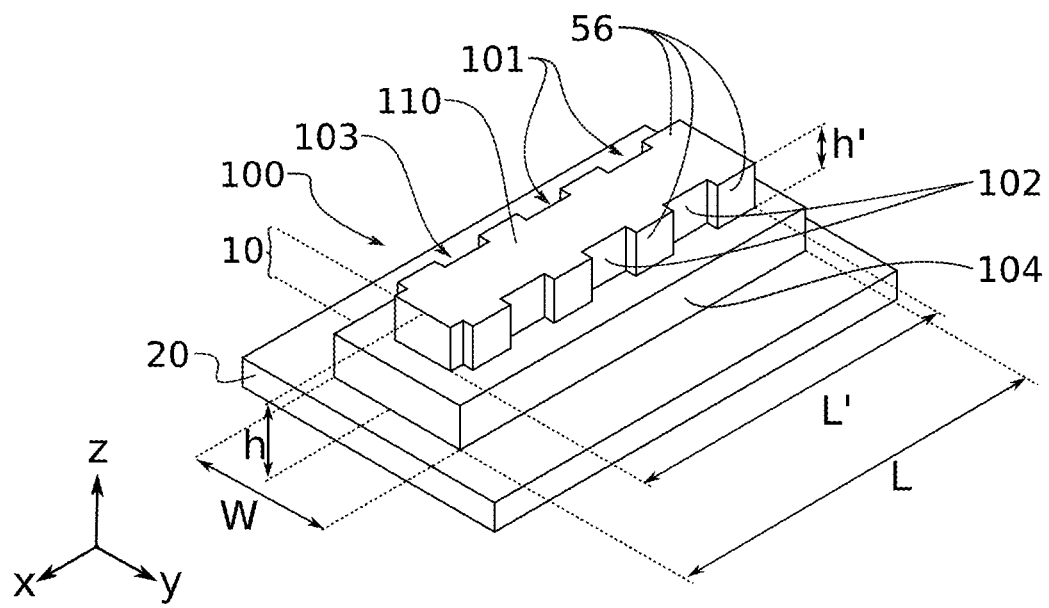
FIG. 2A schematically illustrates a laterally structured DFB laser waveguide according to an embodiment of the present invention.
Figure 2B:
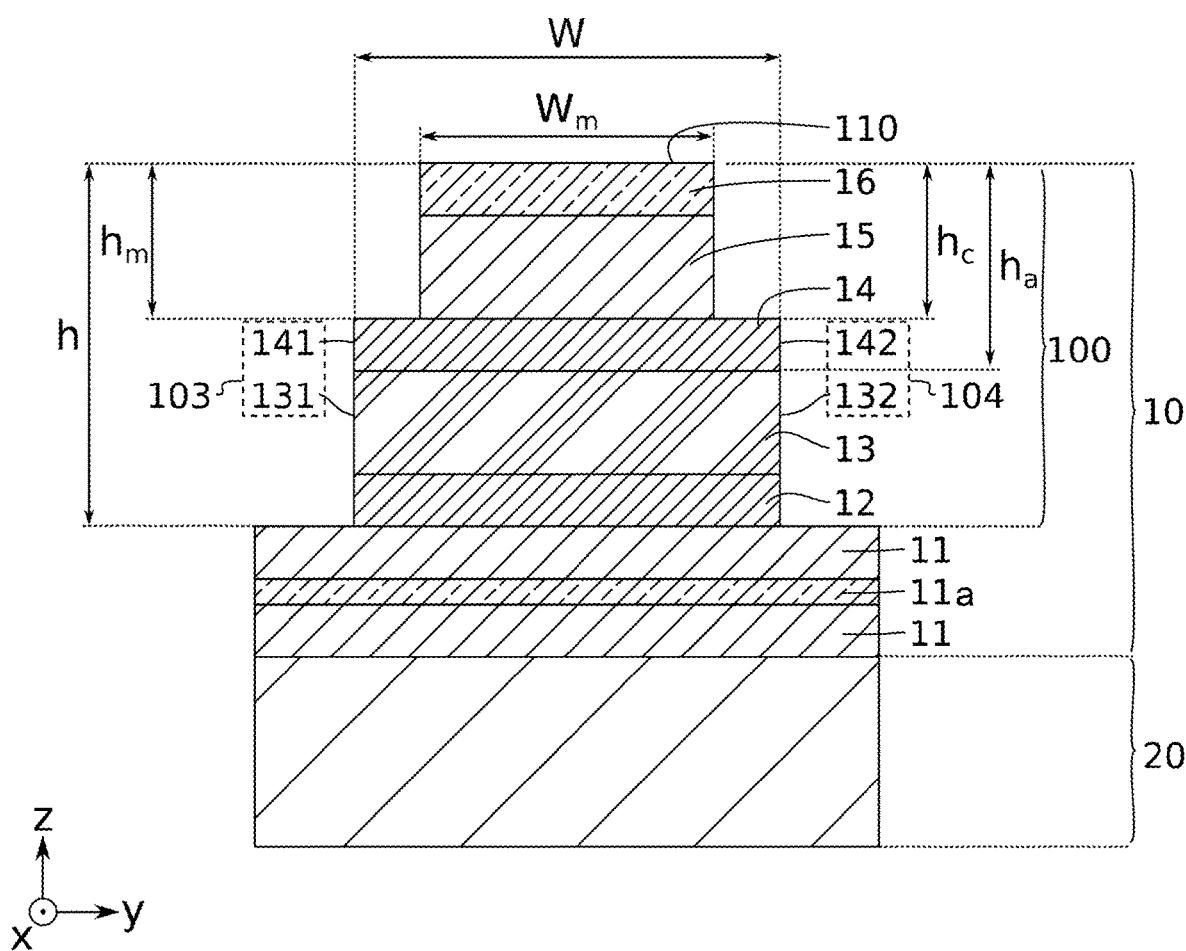
FIG. 2B schematically illustrates in cross-section the laterally structured DFB laser waveguide illustrated in FIG. 2A, according to an embodiment of the present invention.

A first example of a laser according to the invention is illustrated on FIG. 2A, 2B. In this example, a waveguide 100 made of III-V materials is formed on a substrate 20. This waveguide 100 comprises at least one active region 13 designed to emit a light radiation with a wavelength λ. Advantageously, the laser comprises a lateral DFB formed in a top portion of the waveguide, said top portion located above the active region 13, along z.

The waveguide 100 typically has a length L along x, a width w along y and a height h along z. The length L is typically of the order of a few hundred microns to a few millimetres, for example between 500 µm and 4 mm, or even 6 mm. For example, L=1 mm or L=2 mm is preferably chosen. The width w is of the order of a few microns, for example between 4 µm and 10 µm, for example w=8 µm. The height h is typically of the order of a few microns, for example between 1 µm and 10 µm, for example h=5 µm. Since the DFB is formed laterally on the flanks of the waveguide, on the top portion of the waveguide 100, the optical mode of propagation of the light radiation has a good coupling with the DFB grating.

The waveguide 100 may be a ribbon waveguide with a transverse rectangular cross-section, or a ridge waveguide with a transverse inverted T-shaped cross-section. In the case of a ridge waveguide, the top portion of the waveguide is typically in the form of a longitudinally extending mesa of length L, width $w_m$<w and height $h_m$<h. The width $w_m$ may be of the order of 50% to 80% of the width w. The height hm is typically of the order of a few hundred nanometres to a few microns, for example between 500 nm and 6 µm. The top surface 110 of the waveguide 100 is taken at the top of the mesa. Other waveguide geometries are also possible.

The waveguide 100 may be formed from a vignette comprising a stack 10 of layers 11, 11a, 12, 13, 14, 15, 16 made of III-V materials, transferred onto a silicon-based substrate. This transfer may typically be by molecular bonding. The vignette may be in the form of a two-inch InP substrate on which the stack 10 is formed. Thus, the substrate typically comprises a silicon portion and optionally an InP portion and/or some layers of the stack 10. The InP substrate may be thinned or removed partially or completely during transfer, before or after bonding. The waveguide 100 is formed inside the stack 10.

The stack 10 typically comprises a plurality of layers designed for electron injection, light radiation emission and light radiation guidance.

In one embodiment, the stack 10 may comprise, from the bonding interface to the top surface 110 of the stack along z:
  a layer 11 made of n+ or n++ doped InP, with a thickness between 1.5 µm and 5 µm,
  An n+ or n++ doped InGaAs layer 11a of 100 nm to 300 nm can advantageously be interposed within the above-mentioned n+ or n++ InP layer 11. This n++ InGaAs layer 11a is preferably located at a depth of between 1 µm and 3 µm, ideally between 1.5 µm and 2 µm, from the top surface of the n+ or n++ InP layer 11. This doped InGaAs layer 11a typically has a doping level at least a factor of 10 higher than the doping level of the above-mentioned n+ or n++ InP layer 11.
  an InGaAs-based layer 12, called LOC, with a thickness of between 20 nm and 200 nm.
  an active region 13 with a thickness of between 1.5 µm and 4 µm. The active region is located at a height ha along z starting from the top surface 110.
  an InGaAs-based layer 14, called LOC, with a thickness of between 20 nm and 200 nm. The LOC layer 14 is located at a height hc along z starting from the top surface 110.
  an InP-based layer 15 with a thickness of between 1 µm and 3 µm, and a low doping level.
  a layer 16 made of on n+ or n++ doped InGaAs, with a thickness between 20 nm and 100 nm. This doped InGaAs layer typically has a doping level at least a factor of 10 higher than the doping level of the underlying InP layer.

The n+ or n++ doped layers typically participate in injecting electrons into the active region. The LOC layers 12, 14 typically help to confine light radiation in the active region. They typically have a low refractive index, for example of the order of 3.17 for a wavelength λ of the order of 7.4 μm, and are called guiding layers. The low doping level of the 15 InP layer helps to minimise optical losses. The relatively large thickness of this InP layer 15 helps to homogeneously distribute the electron injection throughout the active region.

The active region 13 typically comprises a multiplicity of quantum wells wherein an electron will transit in a cascade, while emitting light radiation. In one embodiment, the active region 13 may comprise alternating InGaAs and AllnAs layers. The reader may refer to the document "Carras, M. et al. Top grating index-coupled distributed feedback quantum cascade lasers. Appl. Phys. Lett. 93, 011109 (2008)" on how to design the active region, particularly on how to choose InGaAs/AllnAs heterostructures, the number of periods and/or quantum wells, and the resonant superlattice architecture.

In the case of a ridge waveguide, the mesa can typically be formed at the top two layers of the stack 10, the InP layer 15 and the n+ or n++ doped InGaAs layer 16.

Advantageously, a portion of the stack 10, located above the active region 13, is structured at its lateral flanks 101, 102 so as to form a distributed Bragg reflector or lateral DFB. The waveguide 100 thus typically has corrugations 56 on the lateral flanks 101, 102. These corrugations 56 are regularly distributed along x in a period Λ. The period Λ is preferably chosen such that $\Lambda = m \cdot \lambda/2n$, λ being the wavelength of the light radiation, n being the effective refractive index of the optical mode of propagation of the light radiation, and m the grating order of the Bragg reflector. All the lateral corrugations form the lateral DFB of length L' and height h'.

The corrugations 56 are arranged on either side of the flanks 101, 102, facing each other along y. They each have a dimension d along y and a dimension I along x. Advantageously, the corrugations 56 have a height $h' < h_a$, such that they extend only in the top portion of the stack 10. The lateral flanks 131, 132 of the active region 13 are thus free of any lateral corrugations. This helps to minimise the optical losses of the laser. In one embodiment, the corrugations 56 have a height $h' < h_c$. The lateral flanks 141, 142 of the LOC layer 14 are thus free of any lateral corrugations. This further minimises the optical losses of the laser. In one embodiment, the height h' of the lateral corrugations is equal to the height $h_m$ of the mesa. The height h' of the lateral corrugations is preferably greater than or equal to 500 nm, for example of the order of 1 μm or 2 μm.

The dimension d is of the order of a few microns, for example 1.5 μm. For example, the dimension I is equal to half a period Λ/2. The overall width of the DFB, including the corrugations 56 is preferably equal to the width of the top of the waveguide 100, w or $w_m$. Accordingly, the top portion of the waveguide laterally structured as a DFB may have alternating narrow portions with width 5 μm and broad portions, at the corrugations 56, with width 8 μm for example. Advantageously, the width modulation in y is chosen such that $d/\Lambda \geq 1$. In one example, the period Λ and the dimension d are chosen such that $d/\Lambda = 1.5$. In another example, the period Λ and the dimension d are chosen such that $d/\Lambda = 2$. This helps to improve the coupling strength of the Bragg grating. The DFB reflectivity is enhanced.

Figure 3A:
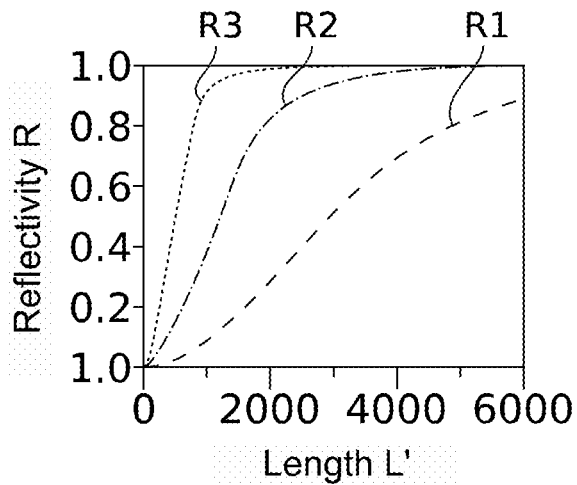
FIG. 3A illustrates the reflectivity of a laterally structured distributed Bragg reflector for different ratios $d/\Lambda$, for a height of lateral corrugations h'=1.2 µm and for a waveguide width w=6 µm, according to an embodiment of the present invention.
Figure 3B:
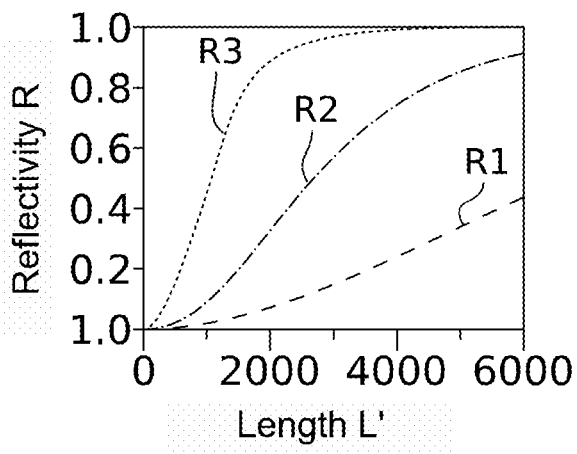
FIG. 3B illustrates the reflectivity of a laterally structured distributed Bragg reflector for different ratios $d/\Lambda$, for a height of lateral corrugations h'=1.2 µm and for a waveguide width w=8 µm, according to an embodiment of the present invention.
Figure 3C:
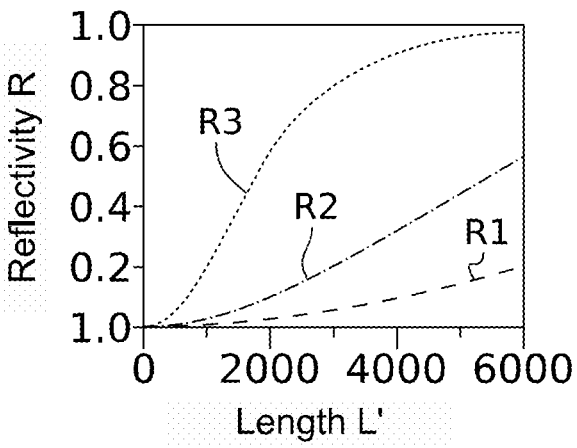
FIG. 3C illustrates the reflectivity of a laterally structured distributed Bragg reflector for different ratios $d/\Lambda$, for a height of lateral corrugations h'=1.2 µm and for a waveguide width w=10 µm, according to an embodiment of the present invention.

FIGS. 3A to 3C illustrate simulated reflectivity curves plotted according to the DFB's length L' for a lateral corrugations height h' of 1.2 μm. Curves R1, R2, R3 correspond to different ratios d/Λ. In particular, curve R1 corresponds to a ratio d/Λ=0.42(d=500 nm), curve R2 corresponds to a ratio d/Λ=0.85(d=1 μm), and curve R3 corresponds to a ratio d/Λ=1.71(d=2 μm). For these simulations, the waveguide has a mesa architecture. The mesa is formed at the layers 15, 16. The lateral corrugations extend on the entire height of the mesa such that $h' = h_m = h_c$. The lateral corrugations do not extend in the optical confinement layer 14.

Simulations are performed for a half-cavity with length L'/2 and for different waveguide widths, in particular for w=6 μm (FIG. 3A), for w=8 μm (FIG. 3B), for w=10 μm (FIG. 3C).

It appears that the reflectivity R(L') increases as the width w of the guide decreases, for a given DFB length L' and for a fixed d/Λ ratio. The coupling between the optical mode of propagation of the light radiation and the lateral DFB improves as the width w of the guide decreases. Furthermore, for a given DFB length L' and for a fixed width w, it appears that the reflectivity R(L') increases as the ratio d/Λ increases. A waveguide with a width of less than or equal to 10 μm and a d/Λ ratio greater than or equal to 1 is thus preferably chosen, and more preferably a width of less than or equal to 8 μm and a d/Λ ratio strictly greater than 1. This helps to design lateral DFBs of reasonable length L', typically less than 3 mm, and having a good reflectivity R, typically greater than 95%. Such DFB dimensions are perfectly compatible with the QCL lasers mentioned above.

Figure 4A:
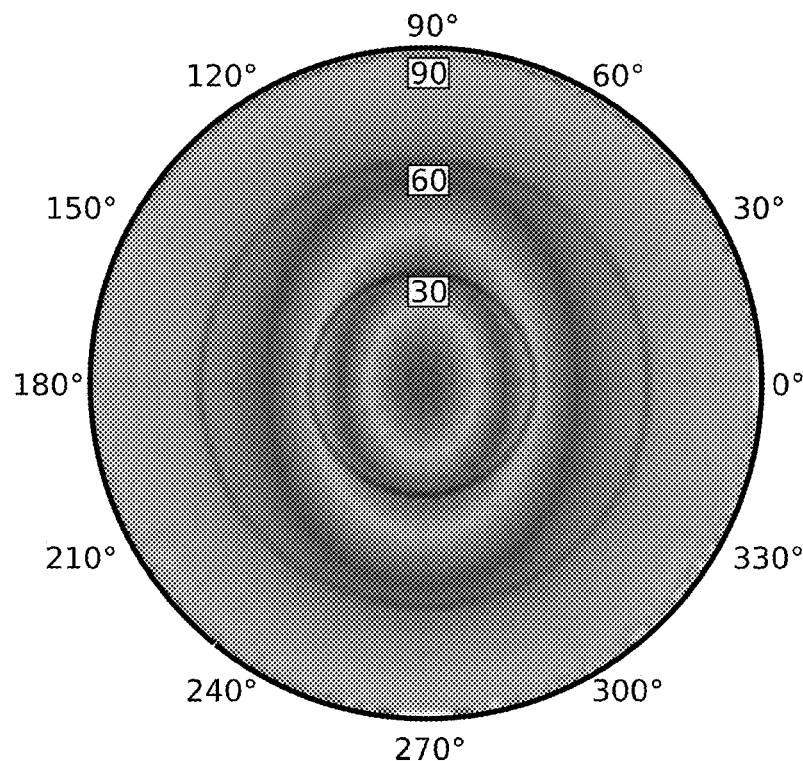
FIG. 4A illustrates the far field distribution of the intensity emitted by a laser with no lateral DFB structuring.
Figure 4B:
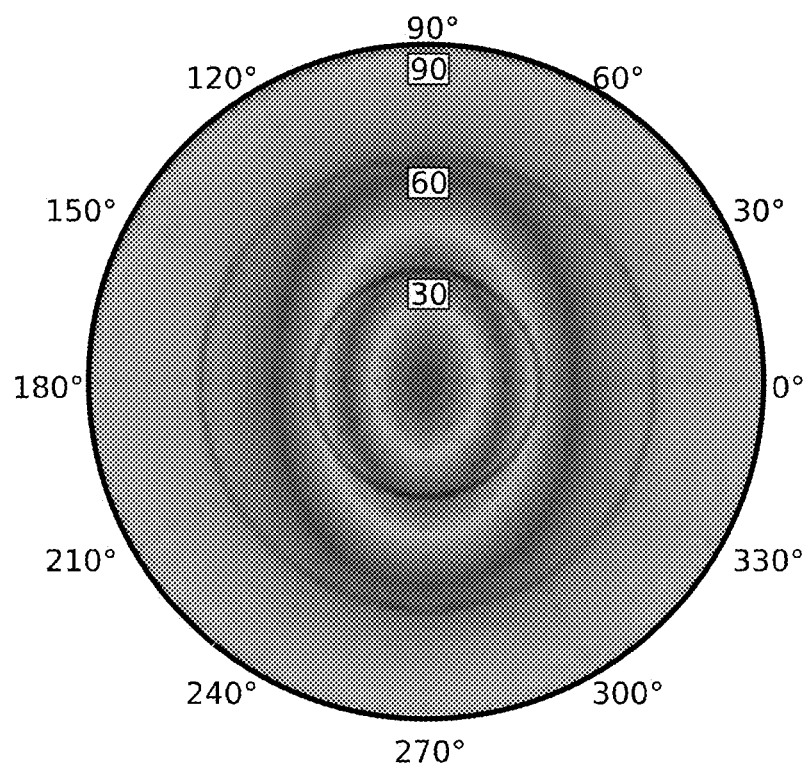
FIG. 4B illustrates the far field distribution of the intensity emitted by a laser with lateral DFB structuring, according to an embodiment of the present invention.

Additionally, such lateral DFBs have little effect on the near-field and/or far-field intensity distribution of the light radiation. FIGS. 4A, 4B illustrate a comparative example of simulated far-field intensity distributions for a waveguide with width w=8 μm, without a DFB (FIG. 4A) and with a lateral DFB of ratio d/Λ=1.5 (FIG. 4B). These distributions are very similar. The lateral DFB has little or no impact on the far-field intensity distribution. This is particularly advantageous when coupling lasers with these lateral DFBs to other optical components.

The intensity distribution of the far-field light radiation varies according to the ratio d/Λ, along the direction z perpendicular to the layers of the stack, and along the direction y parallel to the layers of the stack. However, this variation remains low. The divergence of the light radiation along z is thus reduced, as illustrated on Table 1. The divergence of the light radiation along y is also reduced, as illustrated on Table 2. For example, it is of the order of 1.2% in the case where d/Λ=2 for a guide 6 μm wide.

| Reduction in divergence along z, compared to a waveguide without DFB (%) | $\frac{d}{\Lambda} = 1$ | $\frac{d}{\Lambda} = 1.5$ | $\frac{d}{\Lambda} = 2$ |
| --- | --- | --- | --- |
| Guide width w = 6 μm | 0.12 | 0.22 | 0.34 |
| Guide width w = 8 μm | 0.15 | 0.24 | 0.34 |
| Guide width w = 10 μm | 0.10 | 0.15 | 0.24 |

| Reduction in divergence along y, compared to a waveguide without DFB (%) | $\frac{d}{\Lambda} = 1$ | $\frac{d}{\Lambda} = 1.5$ | $\frac{d}{\Lambda} = 2$ |
| --- | --- | --- | --- |
| Guide width w = 6 μm | 0.72 | 1.00 | 1.21 |
| Guide width w = 8 μm | 0.53 | 0.77 | 0.94 |
| Guide width w = 10 μm | 0.37 | 0.51 | 0.65 |

Figure 5A:
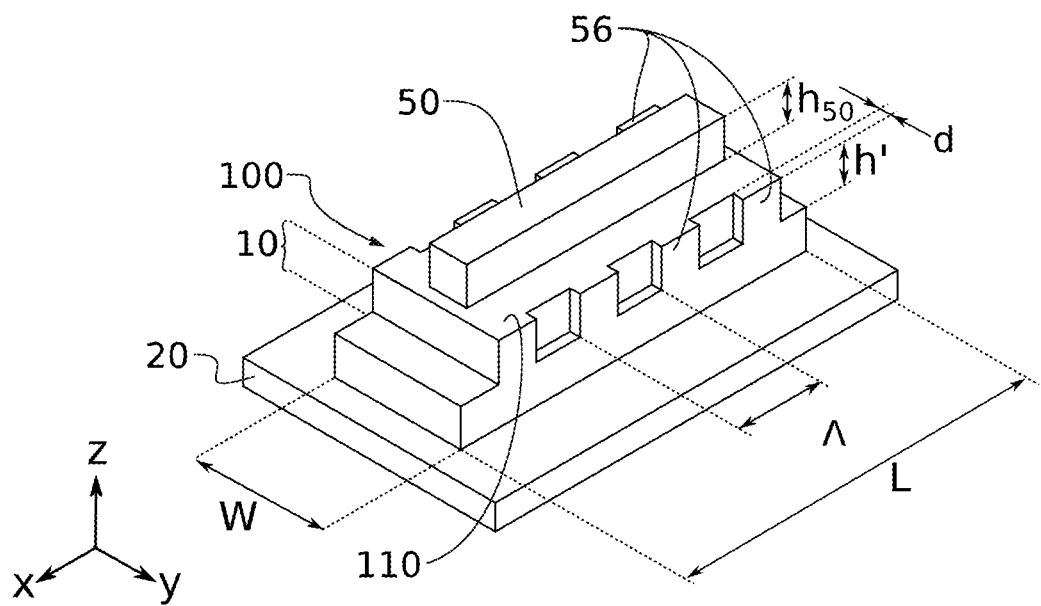
FIG. 5A schematically illustrates a laterally structured DFB laser according to a first embodiment of the present invention.
Figure 5B:
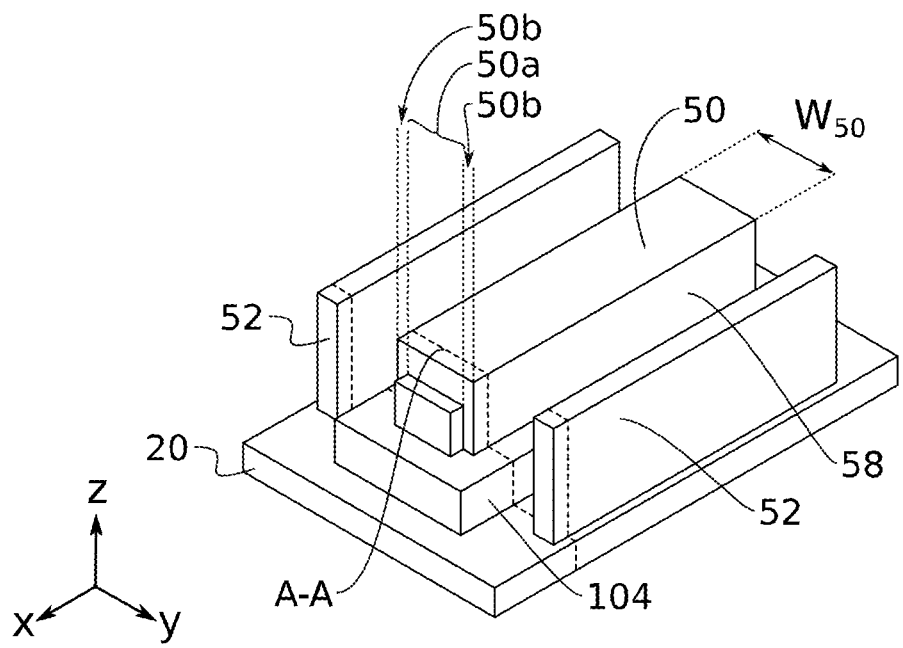
FIG. 5B schematically illustrates a laterally structured DFB laser according to a second embodiment of the present invention.
Figure 5C:
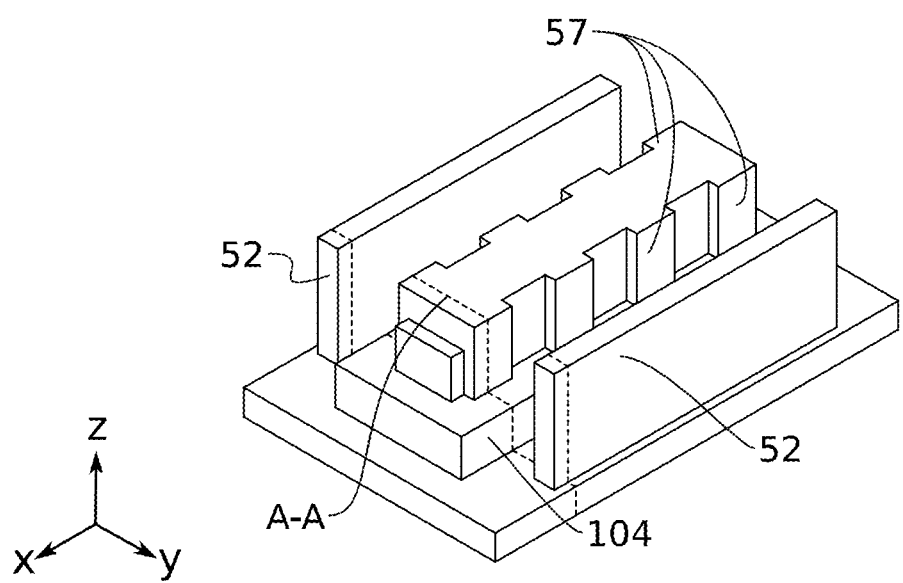
FIG. 5C schematically illustrates a laterally structured DFB laser according to a third embodiment of the present invention.

As illustrated on FIGS. 5A-5C, a top electrode 50 is formed on the top portion of the waveguide 100. It is made of metal material. For example, it is composed of one or more layers made of gold, and/or titanium, and/or titanium nitride, and/or aluminium-copper alloy, and/or tungsten.

In one embodiment illustrated in FIG. 5A, the top electrode 50 is formed only on the top surface 110 of the waveguide. It typically has a height $h_{50}$ along z, preferably of between 1 μm and 3 μm.

In another embodiment illustrated in FIG. 5B, the top electrode 50 comprises a central portion also referred to as the top portion 50a located on the top surface 110 of the stack, and lateral portions 50b located on either side of the central portion 50a, and covering the lateral corrugations of the DFB. The lateral portions 50b fill the spaces between the lateral corrugations. Preferably, they cover the lateral corrugations completely. They may be supported on the bottom portion of the waveguide on either side of the mesa. In this example, the lateral portions 50b have substantially flat lateral flanks 58 along xz. The central portion 50a typically has a height $h_{50}$ along z, and the lateral portions 50b typically have a height $h_{50}+h'$ along z. The electrode 50 has a width $w_{50}$ greater than the width $w_m$ of the mesa. Such an electrode 50 helps to improve the DFB's effectiveness. The reflectivity of the lateral DFB is increased in the presence of the lateral portions 50b of the electrode 50. Electronic injection via this electrode 50 is also improved.

In another embodiment illustrated in FIG. 5C, the top electrode 50 also covers the top surface and the lateral corrugations, as in the previous embodiment. In this example, the lateral flanks of the lateral portions 50b are not flat. The lateral portions 50b of the electrode 50 have the same type of lateral corrugations as the DFB. The corrugations 57 of the electrode 50 may conform or nearly conform to the lateral corrugations of the DFB. This helps to further improve the efficiency of the DFB, particularly if the thickness in y of the corrugations 57 is less than or equal to 20 nm. Electronic injection via this electrode 50 is also improved.

Figure 6A:
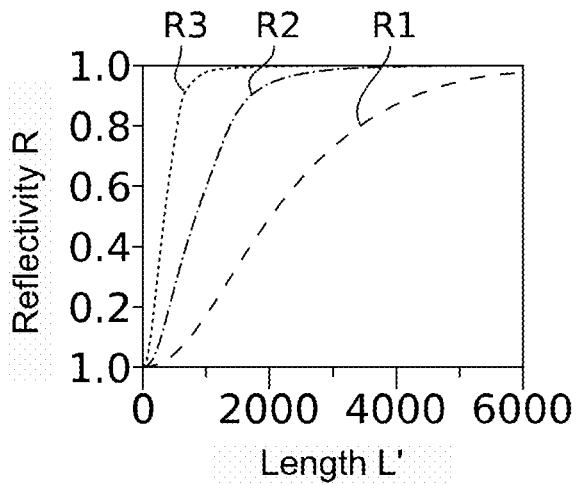
FIG. 6A illustrates the reflectivity of a laterally structured distributed Bragg reflector for different ratios $d/\Lambda$ and for a height of lateral corrugations h'=1.2 µm, with no metal cover on said lateral corrugations, according to an embodiment of the present invention.
Figure 6B:
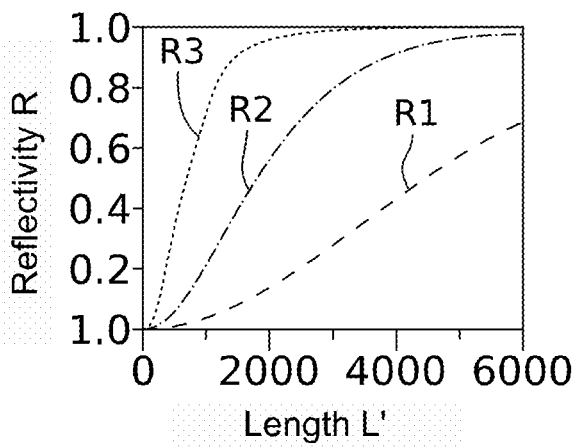
FIG. 6B illustrates the reflectivity of a laterally structured distributed Bragg reflector for different ratios $d/\Lambda$ and for a height of lateral corrugations h'=500 nm, with no metal cover on said lateral corrugations, according to an embodiment of the present invention.
Figure 6C:
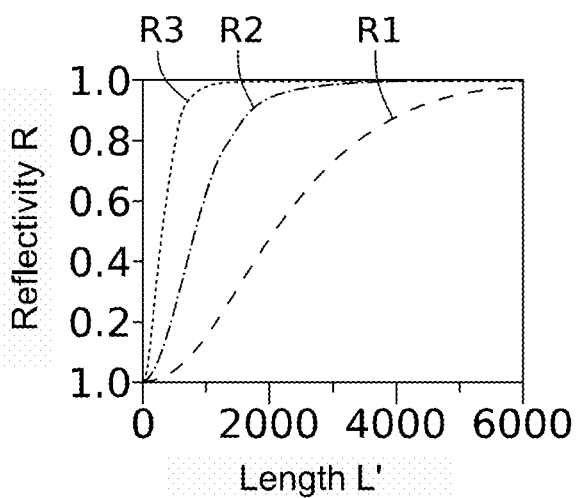
FIG. 6C illustrates the reflectivity of a laterally structured distributed Bragg reflector for different ratios $d/\Lambda$ and for a height of lateral corrugations h'=500 nm, with metal cover on said lateral corrugations, according to an embodiment of the present invention.

FIGS. 6A to 6C illustrate simulated reflectivity curves plotted according to the DFB's length L' for a waveguide width w of 6 μm. Curves R1, R2, R3 correspond to different ratios d/Λ. In particular, curve R1 corresponds to a ratio d/Λ=0.42 (d=500 nm), curve R2 corresponds to a ratio d/Λ=0.85 (d=1 μm), and curve R3 corresponds to a ratio d/Λ=1.71 (d=2 μm).

The simulations are performed for different DFB and electrode configurations. FIG. 6A presents curves R1, R2, R3 obtained for corrugations of height h'=1.2 μm, with no lateral electrode covering the DFB. FIG. 6B presents curves R1, R2, R3 obtained for corrugations of height h'=500 μm, with no lateral electrode covering the DFB. FIG. 6C presents curves R1, R2, R3 obtained for corrugations of height h'=500 μm, with lateral metal electrode covering the DFB.

High reflectivity R(L') may be achieved in the case where the ratio d/Λ is greater than 1, especially when the height of the lateral corrugations is large (FIG. 6A).

By decreasing the height of the corrugations, the reflectivity decreases (FIG. 6B). The presence of the metal electrode on the lateral corrugations of the DFB helps to increase the reflectivity, even when the height of the corrugations is small (FIG. 6C).

Accordingly, waveguides with width less than 8 μm with DFBs having a d/Λ>1 ratio are good candidates for efficient QCL lasers, particularly when the lateral corrugations of the DFBs are covered by metal, as illustrated for the embodiments on FIGS. 5B, 5C.

The laser according to the present invention, comprising a lateral DFB formed in the top portion of the waveguide, without lateral corrugations at the flanks of the active region, can advantageously be integrated into an environmental sensor operating in the mid-infrared range.

FIGS. 7A to 7H illustrate an embodiment of a method for making such a laser.

Figure 7A:
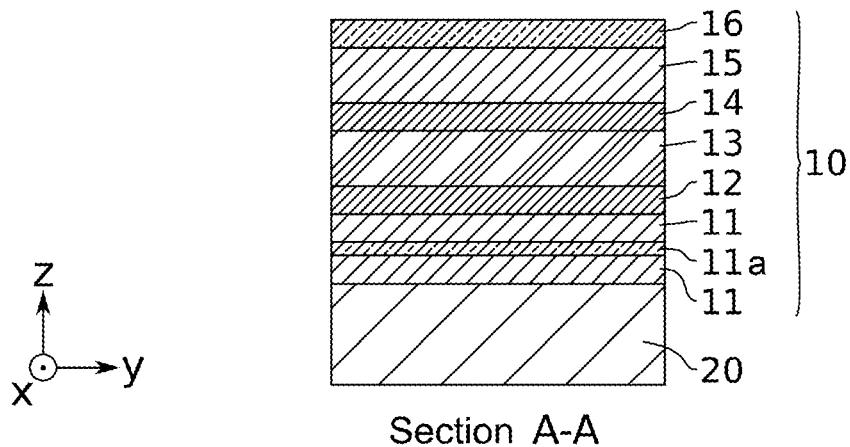
FIGS. 7A to 7H schematically illustrate, in cross-section, steps of a method for making a laterally structured DFB laser according to an embodiment of the present invention.

A stack 10 of layers 11, 11a, 12, 13, 14, 15, 16 carried by a substrate 20 is first provided (FIG. 7A). As previously described, the substrate 20 may be made of silicon. The stack 10 comprises layers made of III-V materials, including:
- a layer 11 made of n+ or n++ doped InP, with a thickness between 1.5 μm and 5 μm,
- an n+ or n++ doped InGaAs layer 11a of 100 nm to 300 nm can advantageously be interposed within the above-mentioned n+ or n++ InP layer 11. This n++ InGaAs layer 11a is preferably located at a depth of between 1 μm and 3 μm, ideally between 1.5 μm and 2 μm, from the top surface of the n+ or n++ InP layer 11. This doped InGaAs layer 11a typically has a doping level at least a factor of 10 higher than the doping level of the above-mentioned n+ or n++ InP layer 11.
- an InGaAs-based layer 12, called LOC, with a thickness of between 20 nm and 200 nm,
- an active region 13 comprising quantum wells and with a thickness of between 1.5 μm and 4 μm,
- an InGaAs-based layer 14, called LOC, with a thickness of between 20 nm and 200 nm,
- an InP-based layer 15 with a thickness between 1 μm and 3 μm,
- a layer 16 made of on n+ or n++ doped InGaAs, with a thickness between 20 nm and 100 nm.

Figure 7B:
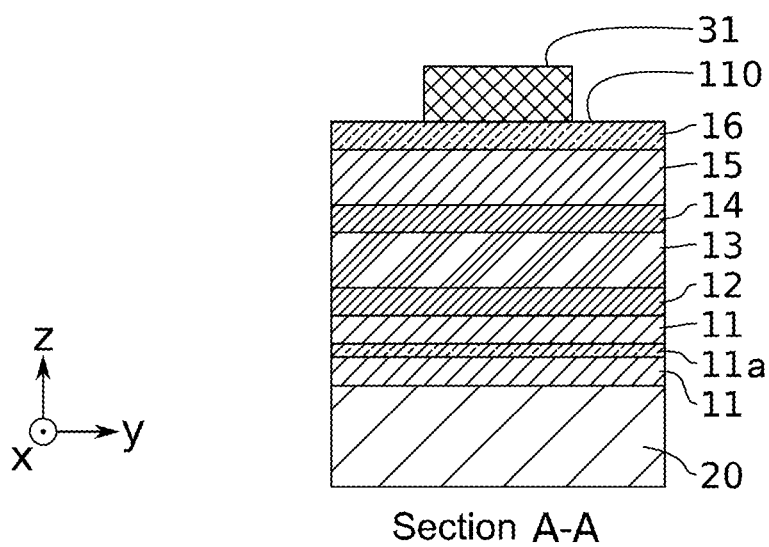
Figure 7C:
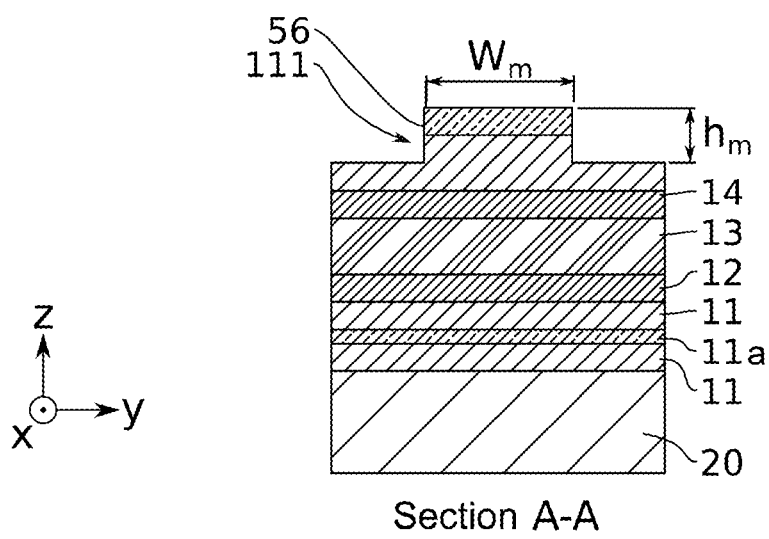

In this example of embodiment, the waveguide formed is a ridge waveguide comprising a mesa top structure. In this instance, the mesa structure forms the top portion of the waveguide comprising the lateral corrugations. In this instance, the lateral corrugations are formed directly at the lateral flanks of this top mesa structure. Accordingly, as illustrated on FIGS. 7B, 7C, a first lithography/etching is performed so as to form this top mesa structure 111 featuring lateral corrugations 56. FIG. 7B illustrates the formation of a photoresist lithography mask 31 used to define the mesa structure with a width $w_m$. The resin mask 31 is structured laterally, typically by deep UV lithography, to define a pattern of lateral corrugations above the layer 16. FIG. 7C illustrates the etching of layers 16 and 15 to a depth $h_m$, stopping in layer 15 of InP. In this instance, the lateral corrugations preferably have a height $h'=h_m$.

In one embodiment, an InGaAs-based etch stopping layer of a few dozen nanometres is proposed in the stack, within layer 15, at a depth h' from the top surface 110 (not illustrated). Such a stopping layer can typically be pseudo-morphic. Advantageously, it helps to stop the etching of layers 16, 15 so as to accurately achieve the desired corrugation height h'.

After structuring the top mesa portion, the resin mask 31 is then removed. The mesa structure 111 with a width $w_m$ and a height $h_m$, having lateral corrugations with a height $h'=h_m$, is thus formed (FIG. 7C).

Figure 7D:
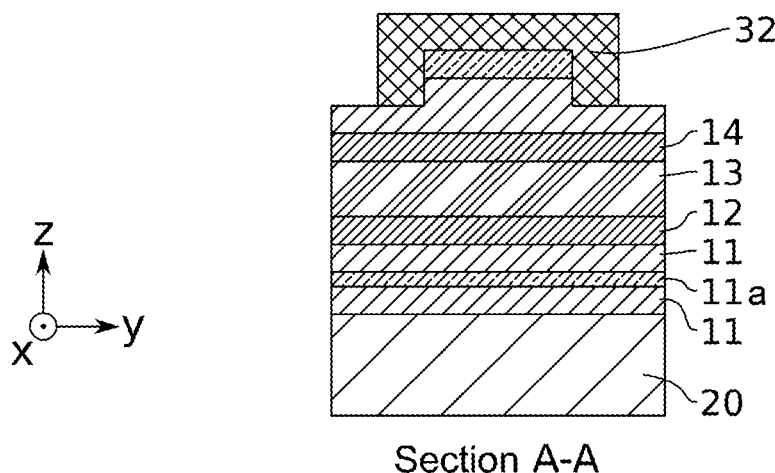
Figure 7E:
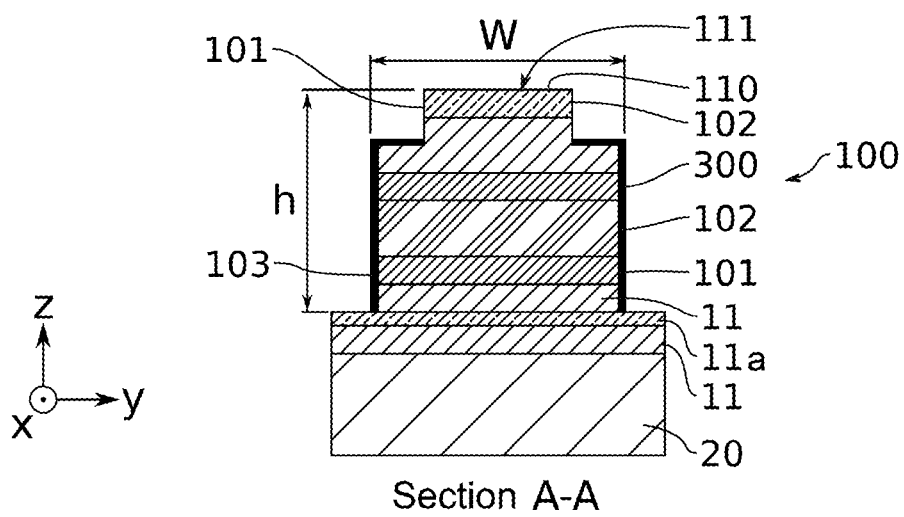

FIGS. 7D, 7E illustrate the formation of a laser pattern in the stack 10 by lithography/etching. FIG. 7D illustrates the formation of a photoresist lithography mask 32 on the mesa structure 111, that helps to define the laser pattern with width w. The laser pattern overlaid by the mesa structure in this instance forms the ridge waveguide 100. FIG. 7E illustrates the etching of layers 15, 14, 13, 12 and 11 at a depth-$h_m$, stopping in the doped InGaAs layer 11a. Such etching is known and can be performed by anisotropic dry etching in z, for example by ICP (Inductively Coupled Plasma). The InGaAs layer 11a can be used for end-of-etch detection, also called end-point detection (EPD).

After removal of the mask 32, a thin passivation layer 300, typically made of SiN with a thickness of about 300 nm, is deposited on the waveguide 100. This passivation layer 300 is opened by lithography/etching at the doped InGaAs layer 11a, so as to allow the formation of the lower electrode, and at the mesa structure, so as to allow the formation of the top electrode. The passivation layer 300 typically covers the flanks 103, 104 of the waveguide 100 (FIG. 7E). Preferably, it does not cover the lateral flanks 101, 102 where the lateral corrugations are located, or the top surface 110 at the top of the mesa structure 111.

Figure 7F:
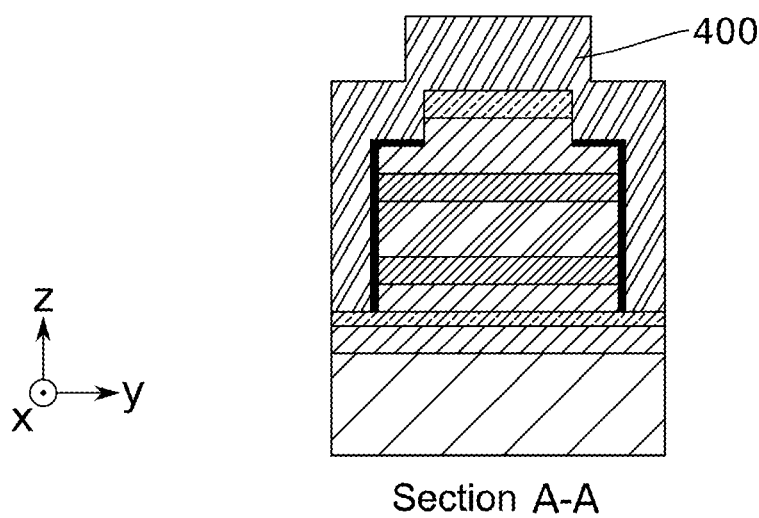

FIG. 7F illustrated the deposition of a metal layer 400 to form the bottom and top electrodes. This metal layer 400 may comprise different sub-layers, for example Ti/TiN adhesion layers and a thick layer of gold or AlCu alloy and/or tungsten. This metal layer 400 preferably has a thickness of approximately 1 µm.

Figure 7G:
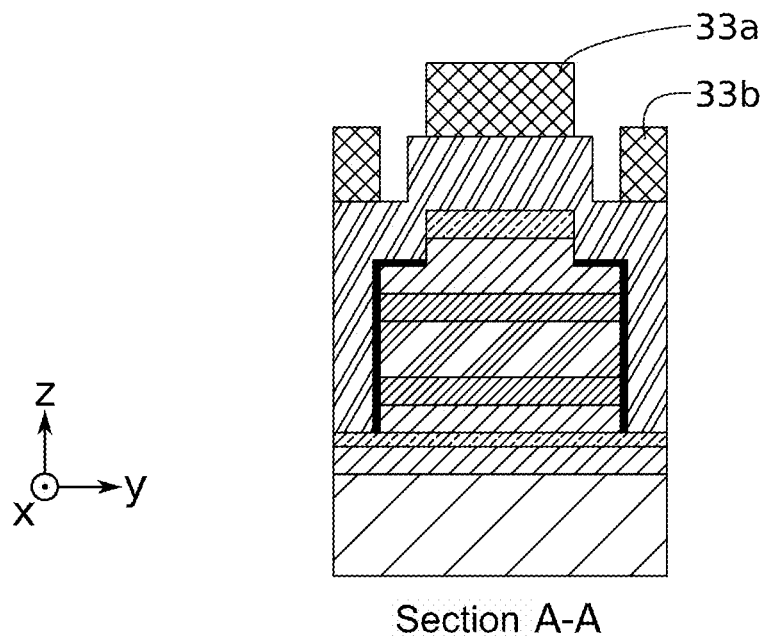

FIG. 7G illustrates the formation of a lithography mask 33 designed to define the top and bottom electrodes. The width of the portion of the mask 33 covering the mesa structure may be less than or equal to $w_m$, such that a top electrode is formed as illustrated on FIG. 5A. Alternatively, the width of the portion of the mask 33 covering the mesa structure may be strictly greater than $w_m$, such that a top electrode is formed as illustrated on FIGS. 5B, 5C. The mask 33 may have a pattern of lateral corrugations, substantially flush with the lateral corrugations 56 of the top portion of the waveguide, such that a top electrode is formed as illustrated in FIG. 5C.

Figure 7H:
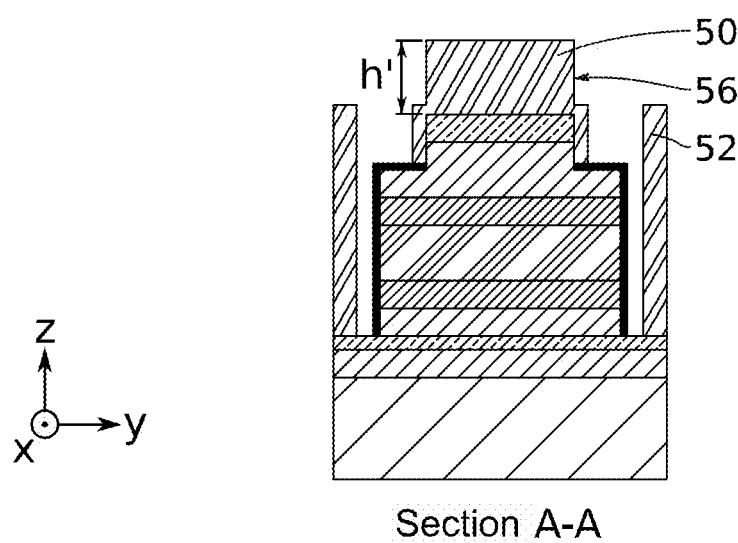

FIG. 7H illustrates the etching of the exposed areas of the metal layer 400, so as to form the top 50 and bottom 52 electrodes. This etch is anisotropic along z. It is configured to stop on the exposed layers of the stack 10. Accordingly, the etch typically stops on layer 15. The mask 33 is then removed. At the end of this etch, the lateral corrugations of the mesa structure can be exposed, or preferably covered by the top electrode 50.

Advantageously, the method helps to produce the DFB QCL laser previously described and illustrated.

The invention is not limited to the previously described embodiments and extends to all embodiments covered by the claims.

In particular, the DFB QCL lasers produced by this method may have other architectures, for example according to a so-called double trench configuration, or according to a configuration allowing two lasers to be contacted with a common electrode.

The invention claimed is:

1. A laser comprising a distributed Bragg mirror,
said laser being configured to emit light radiation along a longitudinal direction and comprising a waveguide formed at least in part in a stack of layers made of III-V materials, said waveguide comprising at least one active region configured to emit said light radiation, said stack having a top surface, the at least one active region being located at a depth $h_a$ measured along a first transverse direction perpendicular to the longitudinal direction and from the top surface, and
said Bragg mirror comprising lateral corrugations distributed periodically along a longitudinal direction in a period Λ, said lateral corrugations being carried by at least one lateral flank of the waveguide parallel to a lateral plane defined by the longitudinal direction and the first transverse direction, said lateral corrugations having a height h' along the first transverse direction and a dimension d along a second transverse direction perpendicular to the longitudinal direction, wherein
the lateral corrugations of the Bragg mirror extend from the top surface of the stack into a first layer of the stack made of a first one of the III-V materials, and the height h' of the lateral corrugations is strictly less than the depth $h_a$,
a second layer of the stack made of a second one of the III-V materials different from the first layer has a top surface in direct contact with the first layer and is formed over the active region,
a portion of the at least one lateral flank of the waveguide is free of any lateral corrugations, said portion being located at the at least one active region and at the second layer.

2. The laser according to claim 1 wherein the lateral corrugations of the Bragg mirror are distributed and designed such that d/Λ>1.

3. The laser according to claim 1 wherein
the second layer comprises at least one optical confinement layer located above the at least one active region, at a depth $h_c$ along the first transverse direction from the top surface, and
the portion of the at least one lateral flank of the waveguide is free of any lateral corrugations at said optical confinement layer.

4. The laser according to claim 1 wherein the lateral corrugations are located from the at least one active region by a distance $h_a$–h' along the first transverse direction, $h_a$–h' being greater than or equal to 200 nm.

5. The laser according to claim 1 wherein the height h' of the lateral corrugations of the Bragg mirror is greater than or equal to 500 nm.

6. The laser according to claim 1 further comprising a top electrode arranged on the top surface of the waveguide.

7. The laser according to claim 6 wherein the top electrode comprises a top portion covering the top surface of the waveguide and at least one lateral portion covering and formed in the lateral corrugations.

8. The laser according to claim 7 wherein the at least one lateral portion of the top electrode has metal corrugations covering the lateral corrugations of the Bragg mirror.

9. The laser according to claim 1 wherein the laser is a quantum cascade laser.

10. A method for forming a laser comprising a distributed Bragg mirror, comprising:
providing a stack of layers made of III-V materials comprising at least one active region for emitting light radiation,
forming a waveguide pattern in the stack of layers, said waveguide pattern having a length L along a longitudinal direction, a height h along a first transverse direction and a width w along a second transverse direction, the first and second transverse directions being normal to the longitudinal direction, said waveguide pattern having a top surface and lateral flanks extending parallel to a lateral plane defined by the longitudinal direction and the first transverse direction, and
structuring said waveguide pattern so as to form lateral corrugations at said lateral flanks, said lateral corrugations being periodic with period Λ along the longitudinal direction and having a dimension d along the second transverse direction, and at least partly forming the distributed Bragg mirror, wherein the structuring is configured such that:

the lateral corrugations of the Bragg mirror extend from the top surface of the waveguide pattern into a first layer of the stack made of a first one of the III-V materials along the first transverse direction to a height h' strictly less than a depth $h_a$, at which the at least one active region is located starting from the top surface of the waveguide pattern, a second layer of the stack made of a second one of the III-V materials different from the first layer has a top surface in direct contact with the first layer and is formed over the active region, and a portion of the lateral flanks of the waveguide is free of any lateral corrugations at the at least one active region and at the second layer.

11. The method according to claim 10 comprising providing the stack with a stopping layer located above the at least one active region, wherein the structuring of the lateral corrugations is configured such that the lateral corrugations do not extend beyond said stopping layer along the first transverse direction, said stopping layer being located at a depth substantially equal to h' with respect to the top surface of the waveguide pattern.

12. The method according to claim 11 wherein the stopping layer is InGaAs-based and has a thickness of between 20 nm and 200 nm.

13. The method according to claim 10 further comprising forming a top electrode pattern that is at least partly on the top surface of the waveguide pattern.

14. The method according to claim 13 wherein forming the top electrode pattern comprises depositing a metal layer on the top surface and in the lateral corrugations, and structuring said metal layer, such that said top electrode pattern has a top portion covering the top surface of the waveguide and at least one lateral portion covering the lateral corrugations.

15. The method according to claim 14 comprising structuring the metal layer such that the at least one lateral portion of the electrode pattern has lateral flanks that are parallel to the lateral plane and free of any lateral corrugations.

16. The method according to claim 14 comprising structuring the metal layer such that the at least one lateral portion of the electrode pattern has metal corrugations covering the lateral corrugations.

17. The laser according to claim 3 wherein the at least one optical confinement layer is InGaAs-based.

18. The laser according to claim 1 wherein each of the second layer and the active region has lateral sides opposing the lateral corrugations of the first layer and each lateral side is free of any lateral corrugations.

* * * * *